US007654361B2

(12) United States Patent
Combest

(10) Patent No.: US 7,654,361 B2
(45) Date of Patent: Feb. 2, 2010

(54) BALANCED CANTILEVER SPRING BRACKET

(75) Inventor: Christopher Combest, Leawood, KS (US)

(73) Assignee: Induction Dynamics LLC, Overland Park, KS (US)

( * ) Notice: Subject to any disclaimer, the term of this patent is extended or adjusted under 35 U.S.C. 154(b) by 442 days.

(21) Appl. No.: 11/463,204

(22) Filed: Aug. 8, 2006

(65) Prior Publication Data

US 2008/0035417 A1 Feb. 14, 2008

(51) Int. Cl.
*H05K 5/00* (2006.01)
*H04R 25/00* (2006.01)
*A47B 81/06* (2006.01)

(52) U.S. Cl. ........................ 181/150; 181/199; 381/152

(58) Field of Classification Search ................. 181/150, 181/199; 381/152
See application file for complete search history.

(56) References Cited

U.S. PATENT DOCUMENTS

| | | | | | |
|---|---|---|---|---|---|
| 3,925,627 | A | * | 12/1975 | Ashworth | 381/152 |
| 4,545,597 | A | * | 10/1985 | Meatto et al. | 280/610 |
| 4,778,134 | A | * | 10/1988 | Struthers et al. | 248/27.1 |
| 5,058,173 | A | * | 10/1991 | Ashworth | 381/152 |
| 5,221,069 | A | * | 6/1993 | Struthers et al. | 248/231.9 |
| 5,388,795 | A | * | 2/1995 | Struthers et al. | 248/231.9 |
| 5,706,358 | A | * | 1/1998 | Ashworth | 381/152 |
| 2003/0141141 | A1 | * | 7/2003 | Combest | 181/199 |
| 2004/0050617 | A1 | * | 3/2004 | Combest | 181/199 |
| 2005/0201571 | A1 | * | 9/2005 | Saint-Vincent et al. | 381/87 |

* cited by examiner

*Primary Examiner*—Jeffrey Donels
*Assistant Examiner*—Christina Russell
(74) *Attorney, Agent, or Firm*—Hovey Williams LLP

(57) ABSTRACT

A bracket for retaining a sound transducer against a soundboard. The bracket is mountable to architectural frame members and is operable to balance the load of the transducer in the bracket. The bracket includes a spring element that is operable to hold the sound transducer against the soundboard with a specified force.

10 Claims, 7 Drawing Sheets

BALANCED CANTILEVER SPRING BRACKET

BACKGROUND OF THE INVENTION

1. Field of the Invention

Embodiments of the present invention relate to acoustic brackets. More particularly, embodiments of the present invention relate to acoustic brackets that hold sound transducers, which impart acoustical energy directly to a solid surface such as a wall or ceiling.

2. Description of the Prior Art

Home theater and audio systems continue to grow in popularity while offering many choices for sound reproduction. Traditional loudspeaker implementations in floor-standing cabinets are widely available. However, customers are increasingly choosing speaker systems that fit within the walls or ceiling of a home or building. Conventional in-wall speakers include a system with a crossover network and standard driver elements such as a woofer and a tweeter. Since the standard driver elements rely on a cone or diaphragm to directly move the air and thus generate sound, openings must be created in the wall to accommodate the system and allow access to the listening area, which may be undesirable in some situations. An alternative to this approach has been developed using sound transducers (such as SolidDrive™ speakers). Sound transducers do not directly move air to generate sound, but instead create sound by oscillating a soundboard (a wall, a ceiling, or other solid surface), which in turn vibrates air molecules to generate sound. Existing transducers are attached to the soundboard with an adhesive and supported by a bracket.

Prior art techniques for mounting sound transducers in walls or ceilings include brackets that utilize foam layers to surround and hold the body of the transducer while it is in operation. Unfortunately, direct contact between the transducer and the foam creates friction and dampens the vibrations of the transducer, thereby limiting the lower frequency response of the audio system. Thus, with prior art bracketing techniques, the performance of the sound transducer is less than optimal.

SUMMARY OF THE INVENTION

The present invention solves the above-described problems and provides a distinct advance in the art of mounting sound transducers in walls and ceilings. More particularly, the present invention provides an improved bracket for mounting and supporting sound transducers that are attached to a soundboard. The present invention allows for optimal performance and frequency response by attaching only to the foot of the transducer to hold it firmly against the soundboard, while allowing the body to move freely along the axis of the shaft and avoid contact with any other object, thereby eliminating any friction or dampening on the body.

One embodiment of the present invention is a bracket operable to mount to first and second architectural frame members such as wall or ceiling studs. The bracket retains a sound transducer and comprises a base, a spring element, and a plate. The base is operable to mount to the first and second architectural frame members. The spring element is attached to the base. The plate is attached to the spring element and has an opening operable to retain the sound transducer against a soundboard when functioning.

In another embodiment, the bracket is operable to mount to first and second architectural frame members and retain a sound transducer and comprises a base, a cantilever spring structure, and a plate. The base is operable to mount to the first and second architectural frame members. The cantilever spring structure comprises first and second flaps attached to the base to provide flexibility for the spring element, first and second risers rigidly attached to the first and second flaps, and first and second platforms rigidly attached to the first and second risers to provide a connection means between the spring element and the plate. The plate is attached to the spring element, elevated from the base, and has an opening operable to retain the sound transducer against a soundboard when functioning and balance the load of the sound transducer in the bracket.

In another embodiment, the bracket is operable to mount to first and second architectural frame members and retain a sound transducer and comprises a base, a cantilever spring structure, and a plate. The base includes first and second mounting tabs that lie flat against the first and second architectural frame members and include a plurality of holes for mounting to the first and second architectural frame members, first and second extenders rigidly attached to the first and second mounting tabs, a crossbar rigidly attached to the first and second extenders, recessed from the mounting tabs, and operable to support the spring element, and first and second flanges rigidly attached to opposing sides of the crossbar, increasing the structural strength of the bracket. The cantilever spring structure exerts a pressure against the soundboard of between 4 lbs and 20 lbs and comprises first and second flaps attached to the base to provide flexibility for the spring element, first and second risers rigidly attached to the first and second flaps, and first and second platforms rigidly attached to the first and second risers to provide a connection means between the spring element and the plate. The plate is attached to the spring element, elevated from the base, and has a circular opening between 2.25 inches and 2.75 inches in diameter and is operable to retain the sound transducer against a soundboard when functioning and balance the load of the sound transducer in the bracket. In various embodiments, the plate of the bracket is cantilevered forward to balance the approximate 1-lb weight of the transducer, which is cantilevered back from the plate. The two cantilevers offset each other to balance the weight at the center of gravity of the transducer and prevent the spring flaps from twisting.

Other aspects and advantages of the present invention will be apparent from the following detailed description of the preferred embodiments and the accompanying drawing figures.

BRIEF DESCRIPTION OF THE DRAWING FIGURES

A preferred embodiment of the present invention is described in detail below with reference to the attached drawing figures, wherein.

Figure 1A:
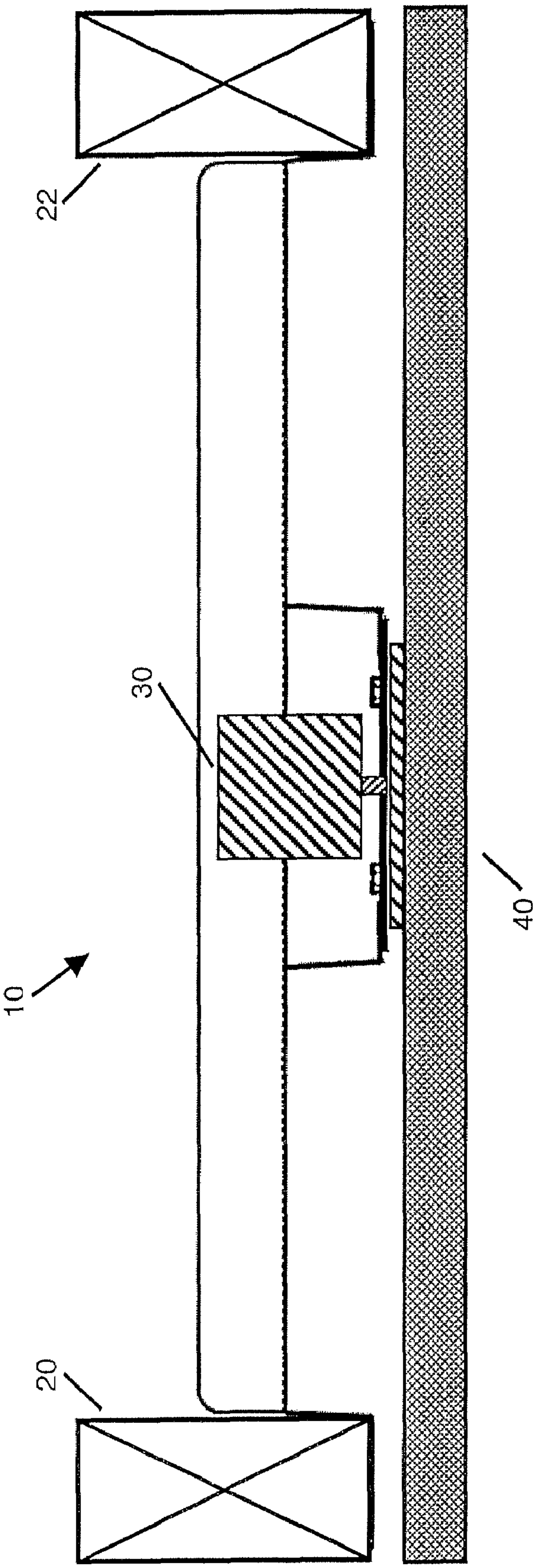
FIG. 1A is a top sectional view of a balanced cantilever spring bracket shown supporting an acoustic component between architectural frame members, prior to attachment of the soundboard to the frame members.

The drawing figures do not limit the present invention to the specific embodiments disclosed and described herein. The drawings are not necessarily to scale and may contain exaggerated portions, emphasis instead being placed upon clearly illustrating the principles of the invention.

DETAILED DESCRIPTION OF THE PREFERRED EMBODIMENTS

The following detailed description of the invention references the accompanying drawings that illustrate specific embodiments in which the invention can be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

Figure 1B:
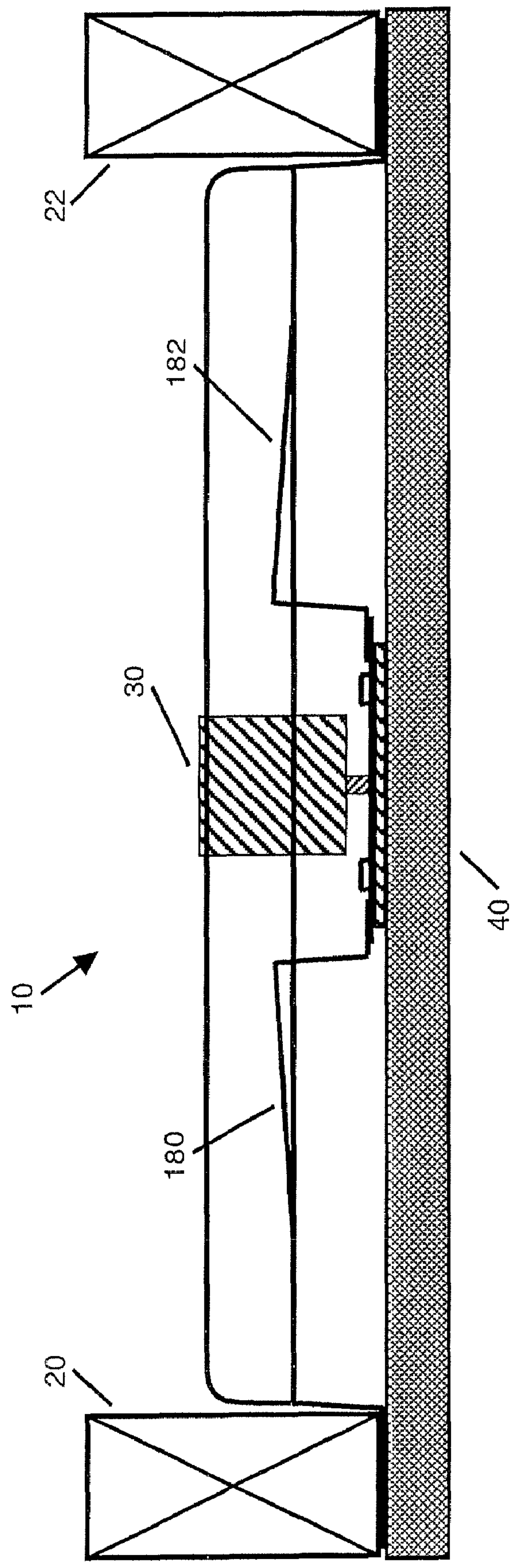
FIG. 1B is a top sectional view of a balanced cantilever spring bracket shown supporting an acoustic component between architectural frame members, after attachment of the soundboard to the frame members.

FIG. 1A illustrates a bracket 10 constructed in accordance with a preferred embodiment of the present invention mounted to a pair of architectural frame members 20, 22 and shown supporting a sound transducer 30 against a soundboard 40, before the soundboard is attached to the frame members. FIG. 1B shows the bracket 10 supporting the transducer 30 against the soundboard 40 after the soundboard is attached to the frame members 20, 22. The spring flaps 180, 182 are activated to hold the transducer 30 firmly against the soundboard 40 with a predetermined force.

A sound transducer 30 is an audio reproduction device, whose function is similar to that of a conventional loudspeaker, wherein the transducer receives an audio signal from an external audio amplifier and converts the electrical energy of the amplifier signal to acoustic energy by physically vibrating the air molecules in the listening area. As opposed to the conventional loudspeaker, which is typically comprised of one or more driver elements equipped with cones or diaphragms that vibrate the air, the sound transducer generates sound by oscillating an intermediate or secondary object which in turn vibrates the air in the listening area. The secondary object is referred to as a soundboard, which can be a wall, a ceiling, or other solid surface. An example of a sound transducer is the SolidDrive™ speaker sold by Induction Dynamics®. U.S. Patent Application No. 2006/0126885 for "Sound Transducer for Solid Surfaces" is herein incorporated by reference.

Figure 2:
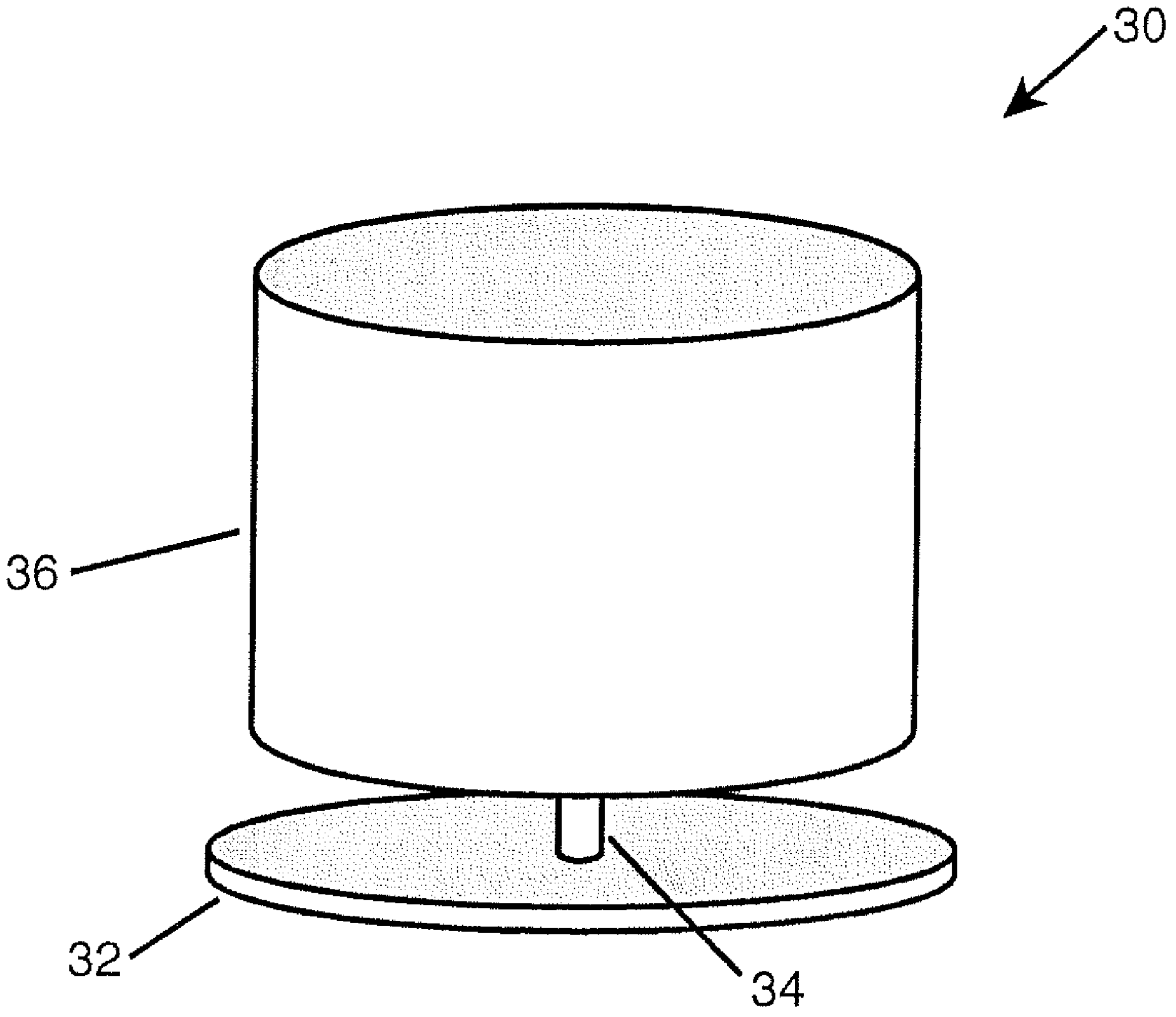
FIG. 2 is a perspective view of a sound transducer.

As shown in FIG. 2, the preferred sound transducer 30 comprises a foot 32, a shaft 34, and a body 36. The following description of the operation of the sound transducer is exemplary and not meant to be taken in a limiting sense. The foot 32 is typically a thin, circular disc that is attached to the soundboard 40 by means of an adhesive or epoxy. The shaft 34 is an elongated cylindrical rod. One end of the shaft 34 is rigidly attached to the center of the foot 32 at an angle normal to the plane of the disc. The body 36 is a large cylinder approximately 2.25 inches in diameter and 2 inches in length, and with an opening on one end that receives the opposing end of the shaft 34. The diameter of the foot 32 is typically larger than the diameter of the body 36. Within the body 36 of the transducer 30, the shaft 34 is rigidly attached to a moving element that is connected to a plurality of voice coils. The shaft 34 is not connected to any other object within the body, except for frictionless bearings. As a result, the body 36 is able to move freely along the axis of the shaft 34 in a "back and forth" fashion, and the shaft is able to slidably move within the body in an "in and out" fashion. Also, within the body 36 is a plurality of permanent magnets. The audio signal from the external audio amplifier generates a changing magnetic field in the voice coils within the presence of the constant magnetic field of the permanent magnets which creates oscillatory motion of the body 36 that transfers energy to the foot 32, which in turn pushes and pulls on the soundboard 40 to create sound. The preferred embodiment of the bracket is operable to retain a single, full-range sound transducer. However, the bracket could also retain a two-way sound transducer which includes a first transducer to reproduce lower frequencies and a second transducer to reproduce higher frequencies. With a similar approach, the bracket could retain two full-range transducers in order to double the power output.

Figure 3:
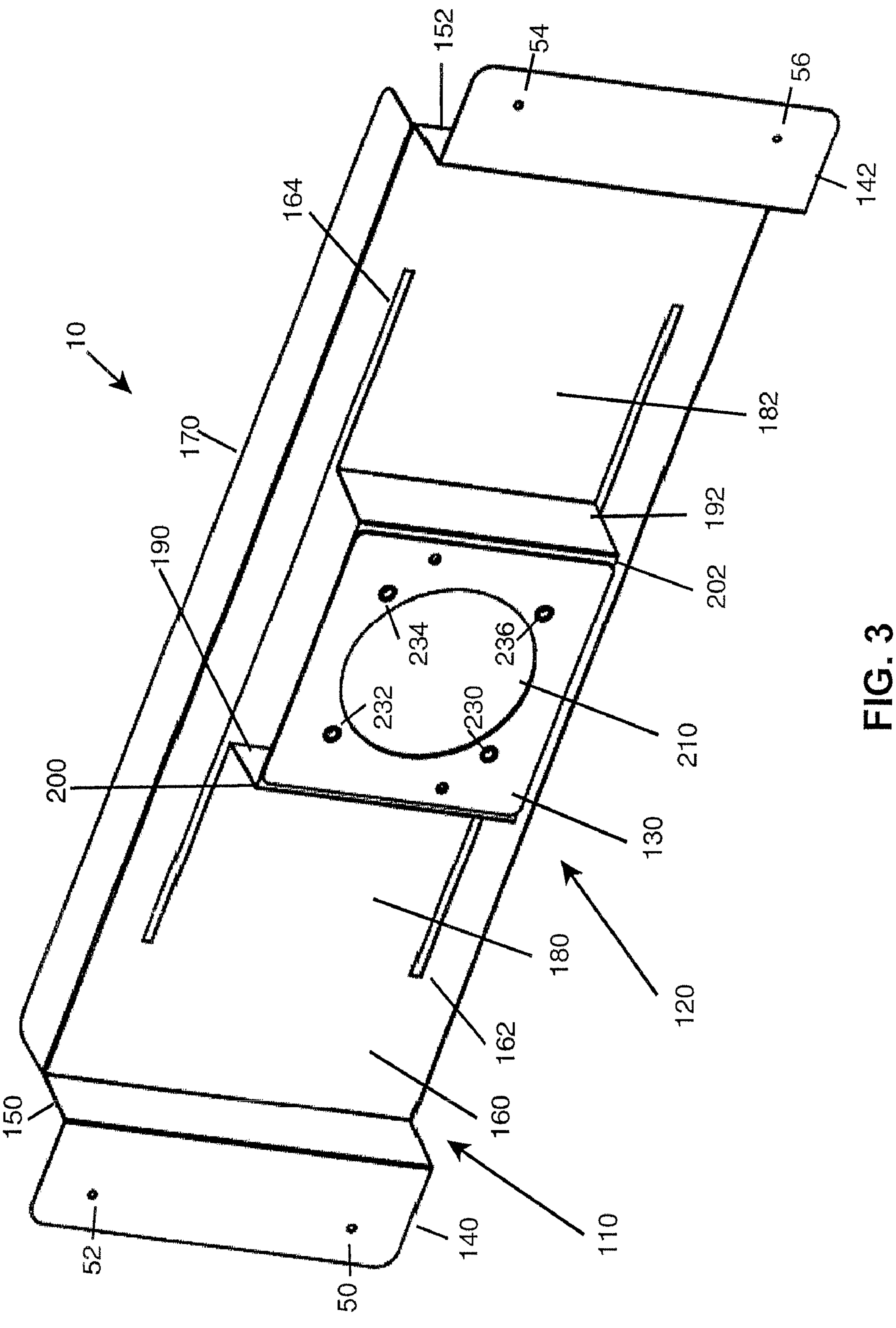
FIG. 3 is a perspective view of the balanced cantilever spring bracket.

The bracket 10 is preferably mountable to architectural frame members 20, 22. The architectural frame members 20, 22 are preferably wall studs of standard housing or office building construction. The frame members could also include ceiling joists. The wall studs and ceiling joists could be constructed of but not limited to 2×4 or 2×6 lumber, aluminum studs, steel studs, other types of metal studs, or other materials. The frame members 20, 22 are preferably located on a 16-inch center-to-center spacing. But the frame members 20, 22 could be placed on a center-to-center spacing between 12 inches and 24 inches, as described in more detail below. As seen in FIG. 3, the bracket 10 includes a plurality of holes 50, 52, 54, 56 for attaching the bracket to the frame members 20, 22. The bracket can be mounted to frame members by inserting screws through the holes 50, 52, 54, 56 and driving the screws into the frame members 20, 22. In this fashion, the bracket 10 could be removed from the frame members 20, 22 if necessary. The bracket 10 could also be mounted by inserting nails through the holes 50, 52, 54, 56 and hammering the nails into the frame members 20, 22. Other means of attachment, such as adhesives or epoxies, are also possible.

The soundboard 40 can be any solid surface such as a wall or a ceiling. It can be located in environments including, but not limited to, housing units, office buildings, or theaters. The soundboard 40 can be constructed from, but not limited to, drywall, wood panels, glass panels, fiberglass panels, or metallic panels. The preferred embodiment of soundboard 40 is drywall attached to frame members in a standard housing or building construction as shown in FIG. 1B.

The bracket 10 is preferably stackable. In order to achieve stackability, the features of the bracket that include bends are implemented at near right angles—approximately 93°. When stacked, this allows features on the top side of a bracket lower in the stack to fit easily within corresponding features on the bottom side of another bracket higher in the stack. However, it is possible to create the bracket of the present invention with features that include bends at right angles without losing the primary functionality of the bracket.

Referring to FIG. 3, the bracket 10 comprises a base 110, a spring element 120, and a plate 130. The base 110 comprises first and second mounting tabs 140, 142, first and second extenders 150, 152, a crossbar 160, and first and second flanges 170, 172. The spring element comprises first and second flaps 180, 182, first and second risers 190, 192, and first and second platforms 200, 202. The plate 130 includes an opening 210 for retaining the sound transducer 30, or preferably the foot 32 of the sound transducer.

The mounting tabs 140, 142 include a plurality of holes 50, 52, 54, 56 for retaining a mounting element such as a nail or a screw to be attached to a frame member, as described above. After attachment and mounting to the frame members 20, 22, the mounting tabs 140, 142 lie flat between the frame members and the soundboard 40, as the soundboard is also attached to the frame members, in order to create the wall, ceiling, or other structure. The tabs 140, 142 are oriented between the frame members 20, 22 and the soundboard 40 such that the plate 130 is facing the soundboard and the flanges 170, 172 are opposing the soundboard.

The mounting tabs 140, 142 are rigidly connected to the extenders 150, 152 at nearly right angles, such that when the bracket 10 is mounted, the extenders extend away from the soundboard 40. The extenders 150, 152 are rigidly connected to opposing ends of the crossbar 160 at nearly right angles, such that the crossbar 160 is located parallel to the soundboard 40 when the bracket 10 is installed. The flanges 170, 172 are rigidly attached to opposing sides of the crossbar 160 at nearly right angles such that they are nearly perpendicular to the plane of the soundboard 40 when the bracket 10 is installed. The purpose of the flanges 170,172 is to add strength and rigidity to the crossbar 160 to help support the load of the sound transducer 30 during operation.

The spring element 120 is created by cutting the crossbar 160 along lines 162, 164 to form flaps 180, 182, risers 190, 192, and platforms 200, 202. The flaps 180, 182 are flexibly connected to the crossbar 160. The risers 190, 192 are rigidly connected to the flaps 180, 182 at nearly right angles, such that the risers extend from the crossbar 160 toward the soundboard 40 when the bracket 10 is installed. The platforms 200, 202 are rigidly attached to the risers 190, 192 at nearly right angles, such that the platforms 200, 202 extend from the risers 190, 192 toward the center of the bracket 10. The platforms 200, 202 are also rigidly connected to the plate 130. On one end of the bracket 10, flap 180, riser 190, and platform 200 are preferably formed from the same piece of material as the crossbar 160 and in combination, they form a cantilever spring with the fixed end of the spring being the point where the flap 180 is connected to the crossbar 160, and the free end of the spring being the platform 200. The same is true on the other end of the bracket 10 with flap 182, riser 192, and platform 202. The connection of the platforms 200, 202 to the plate 130 still allows flexibility, however the flaps 180,182 must flex in unison. The bracket 10 could be constructed from composite or plastic materials that possess rigidity and strength to support the weight of the transducer 30. However, the preferred material of the bracket 10 is galvanized steel with a thickness of 24 gauge as it possesses the appropriate material properties to supply the correct spring constant for the spring element 120.

Figure 4:
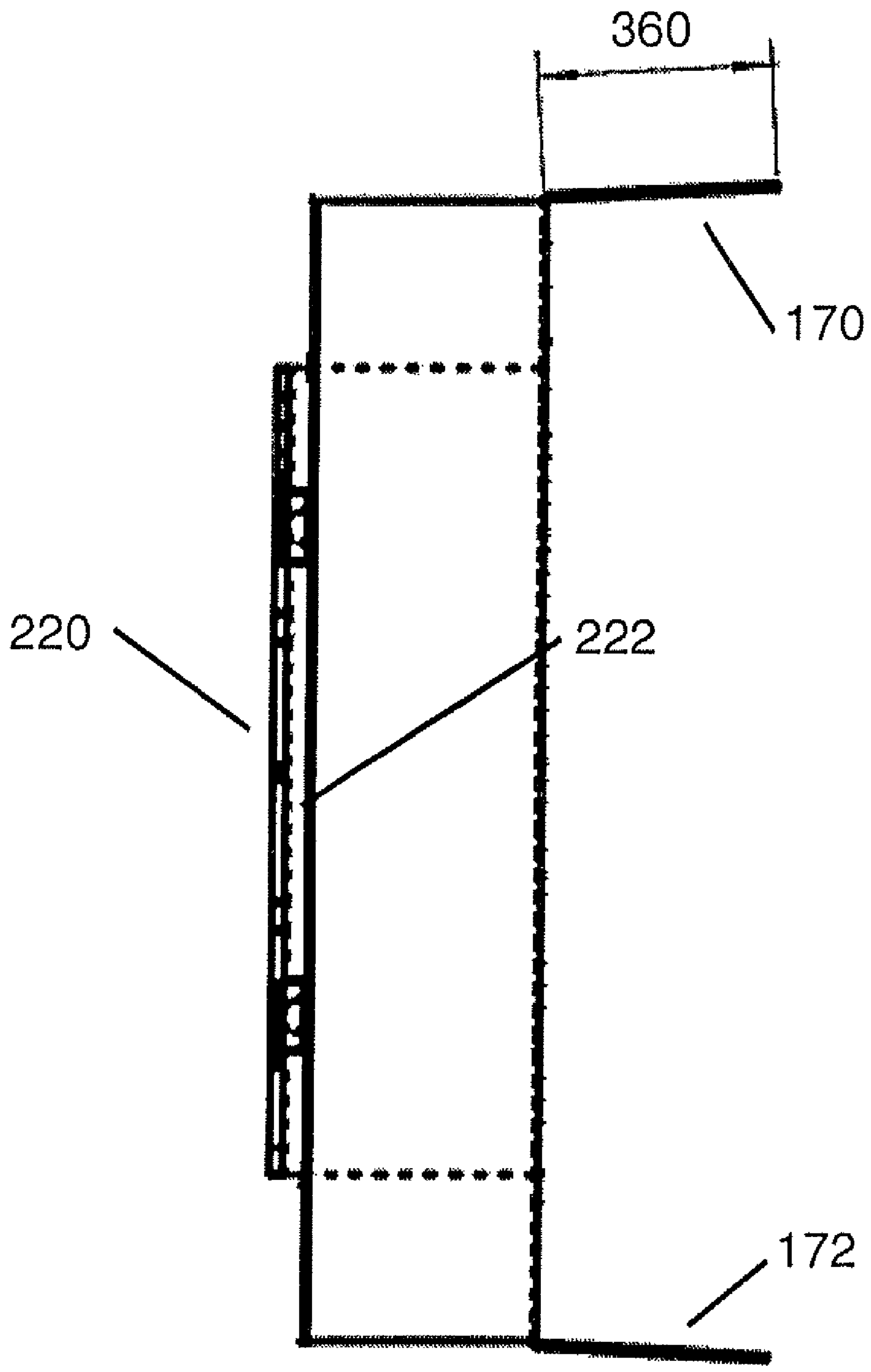
FIG. 4 is a side view of the balanced cantilever spring bracket.

The plate 130 is a separate component, discussed in more detail below, that is rigidly attached to platforms 200, 202, and comprises a top face 220 and a bottom face 222, as best seen in FIG. 4. The plate 130 is preferably nearly square in shape and fits on the platforms 200, 202 so that the center of the plate aligns with the center of the bracket 10. The plate 130 is preferably welded to the platforms 200, 202, but could also be attached by screws or by other means such as adhesives. Once attached, the plate 130 is elevated from the crossbar 160 and the plane of the plate is slightly more elevated from the crossbar than the plane of the mounting tabs 140, 142, as is described in more detail below. Also once attached, the top face 220 of the plate faces the soundboard 40 and the bottom face 222 faces away from the soundboard when the bracket 10 is installed.

The plate 130 includes an opening 210 through which the body 36 of the transducer is placed. The transducer 30 is inserted into the opening on the side of the plate that faces the soundboard 40. The body 36 of the transducer should be inserted completely through the opening 210, as the diameter of the opening 210 should be slightly larger than the diameter of the body 36 of the transducer. However, the diameter of the foot 32 is larger than that of the body 36 and also larger than the diameter of the opening 210. Therefore, the foot 32 comes into contact with the top face 220 of the plate when the body 36 has completely passed through the opening 210. The plate 130 further includes a plurality of holes 230, 232, 234, 236 for mounting the foot 32 to the plate 130. The foot 32 preferably includes some means for mounting that can align to the holes 230, 232, 234, 236 of the plate. In the preferred embodiment, the foot 32 is attached to the plate 130 by placing screws through the mounting means of the foot that also penetrate the holes 230, 232, 234, 236 of the plate. The foot 32 can be implemented such that the screws mount flushly with the surface of the foot, so that there is a substantially smooth surface of the foot to couple with the soundboard 40. The holes 230, 232, 234, 236 of the plate could be threaded to ease attachment or the screws could be coupled with bolts on the bottom side 222 of the plate. Other attachment methods such as adhesives are also acceptable.

In the preferred embodiment, the bracket 10 is comprised of two separate components that are combined to form a monolithic unit. The base 110 and spring element 120 comprise the first component and the plate 130 is the second component. As discussed previously, the preferred material for the bracket 10 is galvanized steel. So the construction of the bracket 10 is discussed with reference to steel. The dimensions of all features of the bracket are discussed in more detail below. The base 110 is formed by cutting a flat piece of steel into the shape of a rectangle whose length is equal to the length of the crossbar 160 of the bracket plus the length of both extenders 150, 152 plus the length of both mounting tabs 140, 142. The width of the rectangle is equal to the width of the crossbar 160 plus the width of both flanges 170, 172. At each corner of the rectangular sheet of steel, a rectangle is cut out whose length is equal to the length of one extender 150 plus one mounting tab 140 and whose width is equal to the width of one flange 170. After the cutouts are removed, the resulting shape of the sheet is a rectangle that is smaller in size than the original that includes a first and second wing, one wing along each side of the rectangle (along the length), and a third and fourth wing, one wing at each end of the rectangle (along the width) for a total of four wings. This smaller rectangle is the crossbar 160. First and second lines 162, 164 are cut along the length of the crossbar, parallel to the sides. Another line is cut between these two lines, such that the center of line 162 is connected to the center of line 164. Thus, the center of the crossbar has three lines cut to form the shape of the letter "H". Holes 50, 52, 54, 56 can be drilled in the third and fourth end wings to provide mounting points for the mounting tabs 140, 142.

The first and second flanges 170, 172 are formed by bending the first and second wings along each side of the crossbar 160 in the same direction such that each wing forms an angle of approximately 93° with respect to the plane of the crossbar 160. The first and second extenders 150, 152 are formed by bending the third and fourth wings along each end of the crossbar 160 in the same direction, and opposing to the direction of the flanges 170, 172, such that each wing forms an angle of approximately 93° with respect to the plane of the crossbar 160. The first and second mounting tabs 140, 142 are formed by bending the first and second extenders 150, 152 along their length away from the center of the crossbar 160 at an angle of approximately 93° with respect to each extender. At this point, the flanges 170, 172 are bent down from the plane of the crossbar 160, the extenders 150, 152 are bent up from the plane of the crossbar, and the mounting tabs are bent away from the center of the crossbar, such that the plane formed by the mounting tabs 140, 142 is parallel to and elevated from the plane of the crossbar.

First and second flaps 180, 182 are automatically formed by cutting lines in the crossbar 160 in the shape of an "H". First and second risers 190, 192 are formed by bending first and second flaps 180, 182 in the same direction, opposing the direction of the flanges, at an angle of approximately 93° with respect to the plane of the crossbar 160. First and second platforms 200, 202 are formed by bending first and second risers 190, 192 toward each other in order to form an angle of approximately 93° with respect to the risers. At this point, the plane formed by the platforms 200, 202 is parallel to and elevated from the plane of the crossbar 160 as well as being slightly elevated above the plane of the mounting tabs 140, 142.

The plate 130 is preferably cut from 19-gauge galvanized steel and is nearly square-shaped. A large, circular opening 210 is cut in the center of the plate 130. A plurality of holes 230, 232, 234, 236 is also cut in the plate around the periphery of the opening 210. The plate 130 is placed on the platforms 200, 202 such that the center of the plate lands in the center of the bracket 10. The plate 130 is then preferably welded to the platforms 200, 202. Other means of attachment are possible.

Two of the important features of the present invention are established and controlled by the dimensions of the elements of the bracket 10. One feature is balancing the load of the transducer in the bracket 10. In order to achieve the balance, the center of gravity of the transducer 30 must lie substantially in the same plane as the plane of the crossbar 160 and the flaps 180, 182. When this condition is met, the weight of the transducer 30 does not induce a torque on the flaps 180, 182, which would cause the flaps to twist either forward or backward with respect to the crossbar 160. As a result, with no torque on the flaps 180, 182, the spring element 120, which is formed in part by the flaps, can maintain the foot 32 parallel to the soundboard 40. The dimensions that affect the balance are discussed below in detail. However, in various embodiments, when the transducer 30 is installed, the center of gravity of the transducer is located approximately 0.25 inches out of the plane of the crossbar 160. This minor displacement is not enough to disrupt the balance and induce a significant torque on the flaps 180, 182. Therefore, the force of the spring element 120 can maintain the foot 32 of the transducer securely against the soundboard 40.

Another feature is holding the transducer against a soundboard with a predetermined force, as shown in FIG. 1B. The spring element 120 is responsible for this feature. By Hooke's law ($F=-kx$), the amount of force F that a spring exerts is determined by the product of the spring constant k and the amount by which the spring is displaced x. It is desired to have approximately 9 lbs of force against the soundboard 40 when the spring element 120 is displaced approximately 0.25 inches, shown in FIG. 1B in an exaggerated form to demonstrate the action of the spring element. Hence, the spring constant $k=F/x=9$ lbs/0.25 in=36 lbs/inch. The spring constant is governed by the type of material that is used, the thickness of the material, and the length of the spring element. The preferred material is established to be galvanized steel. The preferred thickness is 24 gauge. Thicker material gives a higher spring constant or stiffer spring, whereas thinner material yields a lower spring constant. The length of the spring element 120 is discussed in more detail below. However, generally, the longer the spring element 120 is the lower the spring constant or the softer the spring. A shorter spring element yields a greater spring constant.

Figure 5:
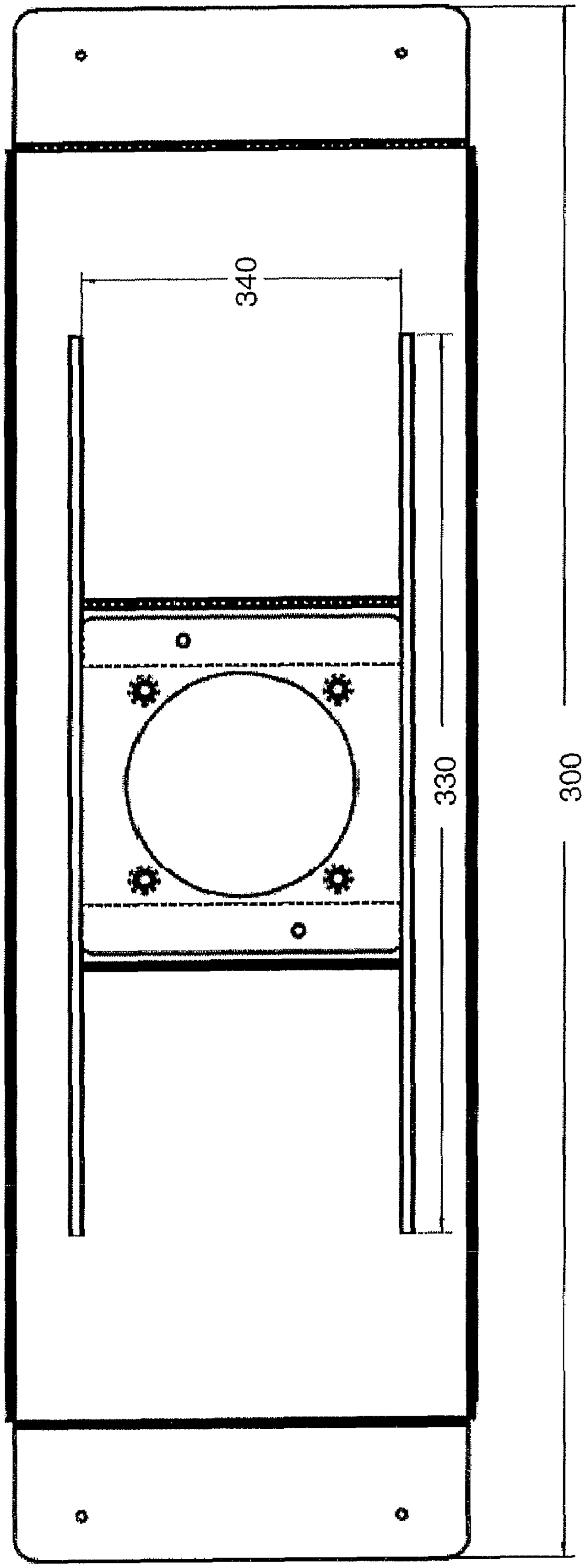
FIG. 5 is a front view of the balanced cantilever spring bracket.
Figure 6:
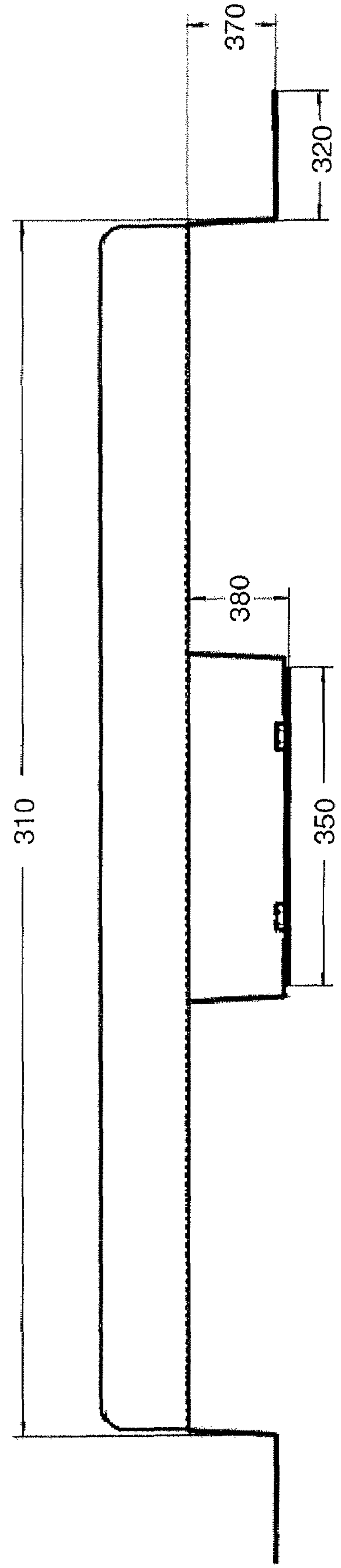
FIG. 6 is a top view of the balanced cantilever spring bracket.

Referring to FIG. 5 and FIG. 6, the following dimensions are for the preferred embodiment. For a 16-inch center-to center frame member spacing, the overall bracket length 300 is 17.25 inches. The crossbar length 310 is 14.25 inches. The mounting tab length 320 is 1.5 inches. The bracket length 300 is the sum of the crossbar length 310 plus two (2) times the mounting tab length 320. To vary the bracket length 300, the crossbar length 310 is adjusted while the mounting tab length 320 is fixed. Thus, for a 12-inch frame member system, the crossbar length 310 is shortened to 10.25 inches, and for a 24-inch frame member system, the crossbar length 310 is increased to 22.25 inches.

The spring element length 330 is determined by the length of the cut lines 162, 164. In order to achieve the proper spring constant, given the thickness of the crossbar as being 24-gauge galvanized steel, the spring element length 330 is 10 inches. The spring element length 330 also determines the lower limit of the crossbar length 310 (and by extension, the bracket length 300) as well as the position of the spring element 120 within the bracket 10. The crossbar length 310 cannot be less than the spring element length 330, or 10 inches. The preferred location for the spring element 120 is in the center of the crossbar 160. However, the spring element 120 can be moved toward one end or the other (closer to the mounting tabs 140, 142) as long as the spring element length 330 is not changed. The spring element width 340, which is also the width of the flaps 180, 182, the risers 190, 192, and the platforms 200, 202, is 3.5 inches.

The plate length 350 is preferably 3.75 inches. The width of the plate 130 is the same as the spring element width 340—3.5 inches. The circular opening 210 of the plate is 2.5 inches in diameter.

The flange width 360 is 1 inch. The flanges 170, 172 have the same length as the crossbar 160, which is preferably 14.25 inches.

The extender height 370 is 1 inch. The riser height 380 is 1.125 inches. Since both the extenders 150, 152 and the risers 190, 192 are connected to the crossbar 160, there is a height differential between the risers and the extenders of 0.125 inches. Therefore, the plate 130 (which is connected to the platforms 200, 202 and the risers 190, 192) is elevated 0.125 inches higher than the mounting tabs 140, 142 (which are connected to the extenders 150, 152). When the bracket 10 is installed and is retaining a sound transducer, the height differential between the plate 130 and the mounting tabs 140, 142 causes the foot of the transducer and hence the plate to be pushed away from the soundboard. When the plate 130 is displaced, so are the flaps 180, 182 (through connection to the risers 190, 192 and platforms 200, 202). Displacement of the flaps 180, 182 (see FIG. 1B) engages the spring element 120, thereby generating a force to push the foot 32 of the sound transducer against the soundboard 40. The pressure helps to ensure a strong glue bond between the foot 32 of the transducer and the soundboard 40 while also continuing to support and balance the weight of the transducer so there is no stress on the glue joint.

The extender height 370 and the riser height 380 also control the balance of the load of the transducer 30 in the bracket 10. Since the foot 32 of the transducer is rigidly fixed to the soundboard 40, the soundboard is the point of reference to which the center of gravity of the sound transducer is measured. Thus, the transducer's center of gravity is a point that is a certain distance from the soundboard. Since the transducer's center of gravity point must lie in the plane of the flaps 180, 182 to achieve a balance in the bracket 10, the plane of the flaps must be the same distance from the soundboard as the transducer's center of gravity. The heights of the extenders 204 and the risers 208 set the distance of the plane of the flaps from the soundboard. As a result, if the size, shape, or composition of the transducer changes leading to a change in the distance of the center of gravity from the soundboard, the heights of the extenders 204 and the risers 208 must be adjusted to match the change, thereby equalizing the plane of the flaps with the transducer center of gravity.

In the preferred embodiment, the bracket 10 is installed prior to attaching the soundboard 40 to the architectural frame members 20, 22. Initially, the bracket 10 is placed between architectural frame members such that the mounting tabs 140, 142 lie flat against the frame members. The bracket 10 is attached to the frame members by either screwing or nailing the mounting tabs 140, 142 to the frame members. The body 36 of the sound transducer is placed through the opening 210 of the plate 130 until the foot 32 encounters the plate. The foot is attached to the plate by means of screws through the holes 230, 232, 234, 236. The surface of the foot 32 is coated with an epoxy or adhesive. The soundboard 40 is first brought into contact with the coated surface of the foot 32, as shown in FIG. 1A. Then, the soundboard is attached to the frame members 20, 22, as shown in FIG. 1B. Pressure from the spring element provides the force to enable the bond between the foot and the soundboard to establish. After a short curing time for the epoxy, the sound transducer is ready for operation. The spring element 120 continues to support and balance the weight of the transducer so there is no stress on the glue joint.

Although the invention has been described with reference to the preferred embodiment illustrated in the attached drawing figures, it is noted that equivalents may be employed and substitutions made herein without departing from the scope of the invention as recited in the claims.

Having thus described the preferred embodiment of the invention, what is claimed as new and desired to be protected by Letters Patent includes the following:

The invention claimed is:

1. A bracket operable to mount to first and second architectural frame members and retain a sound transducer, which includes an oscillating body coupled to a foot, the bracket comprising:

a base operable to mount to the first and second architectural frame members;

a spring element attached to the base; and a plate attached to the spring element and operable to attach to the foot of the sound transducer such that when the plate is attached solely to the foot, the sound transducer is balanced within the bracket and the weight of the sound transducer does not induce a torque on the spring element.

2. The bracket of claim 1, wherein the base is comprised of first and second mounting tabs operable to lie flat against the first and second frame members.

3. The bracket of claim 2, wherein the first and second mounting tabs include a plurality of holes for mounting the bracket to the first and second architectural frame members.

4. The bracket of claim 2, wherein the base is further comprised of a crossbar attached to the first and second mounting tabs through first and second extenders, such that the crossbar is recessed from the mounting tabs and is operable to support the spring element.

5. The bracket of claim 4, wherein the base is further comprised of first and second flanges rigidly attached to opposing sides of the crossbar to increase structural strength of the bracket.

6. The bracket of claim 4, wherein the spring element is a cantilever type, comprised of first and second flaps attached to the crossbar operable to provide flexibility of the spring element.

7. The bracket of claim 6, wherein the spring element is further comprised of first and second platforms attached to the first and second flaps through first and second risers providing a connection means between the spring element and the plate.

8. The bracket of claim 1, wherein the spring element has a spring constant in the range of 16 lbs/in to 80 lbs/in.

9. The bracket of claim 1, wherein the plate further includes an opening between 2.25 inches and 2.75 inches in diameter.

10. The bracket of claim 1, wherein the base further includes a planar crossbar that extends between the first and second architectural frame members such that when the sound transducer is balanced, the center of gravity of the sound transducer lies substantially in the plane of the crossbar.

* * * * *